United States Patent
Koo

(10) Patent No.: US 10,840,175 B2
(45) Date of Patent: Nov. 17, 2020

(54) FILM PACKAGE, CHIP-ON-FILM PACKAGE, AND PACKAGE MODULE

(71) Applicant: Samsung Electronics Co., Ltd., Suwon-si (KR)

(72) Inventor: Jungeun Koo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/138,324

(22) Filed: Sep. 21, 2018

(65) Prior Publication Data
US 2019/0287888 A1 Sep. 19, 2019

(30) Foreign Application Priority Data
Mar. 16, 2018 (KR) .......................... 10-2018-0030833

(51) Int. Cl.
*H01L 23/498* (2006.01)
*H01L 23/552* (2006.01)
*H01L 27/12* (2006.01)
*H01L 23/00* (2006.01)

(52) U.S. Cl.
CPC .... *H01L 23/49838* (2013.01); *H01L 23/4985* (2013.01); *H01L 23/552* (2013.01); *H01L 24/16* (2013.01); *H01L 27/124* (2013.01); *H01L 2224/16227* (2013.01)

(58) Field of Classification Search
CPC ........... H01L 23/49838; H01L 23/4985; H01L 23/552; H01L 27/124
See application file for complete search history.

(56) References Cited

U.S. PATENT DOCUMENTS

| | | | |
|---|---|---|---|
| 7,906,374 B2 | 3/2011 | Lin et al. | |
| 8,823,042 B2 | 9/2014 | Kim | |
| 9,177,904 B2 | 11/2015 | Jung et al. | |
| 9,280,182 B2 | 3/2016 | Ha et al. | |
| 9,349,683 B2 | 5/2016 | Jung et al. | |
| 9,362,333 B2 | 6/2016 | Jung et al. | |
| 9,735,221 B2 | 8/2017 | Fukuma et al. | |
| 2013/0335123 A1* | 12/2013 | Choi | H03K 17/165 327/109 |
| 2016/0218053 A1* | 7/2016 | Cho | G02F 1/13452 |

(Continued)

FOREIGN PATENT DOCUMENTS

KR 10-2009/0089239 A 8/2009
KR 10-2016/0043190 A 4/2016

*Primary Examiner* — Christine A Enad
(74) *Attorney, Agent, or Firm* — Harness, Dickey & Pierce, P.L.C.

(57) ABSTRACT

Disclosed are film packages, chip-on-film packages, and package modules. The film package including a film substrate having a first surface and a second surface facing each other, a plurality of output patterns on the film substrate and each including a first chip pad and an output pads electrically connected to the first chip pad and spaced apart in a first direction from the first chip pad, and a plurality of input patterns on the film substrate and each including a second chip pad adjacent to the first chip pad corresponding thereto and an input pad electrically connected to the second chip pad and spaced apart in the first direction from the second chip pad may be provided. At least portions of the output patterns overlap the input patterns across the film substrate.

20 Claims, 18 Drawing Sheets

(56) References Cited

U.S. PATENT DOCUMENTS

| | | | |
|---|---|---|---|
| 2016/0218065 A1 | 7/2016 | Ha | |
| 2017/0170206 A1* | 6/2017 | Lee | H01L 51/52 |
| 2018/0027651 A1* | 1/2018 | Lim | H05K 1/0281 |
| | | | 361/749 |
| 2018/0123060 A1* | 5/2018 | Jang | H01L 27/1218 |
| 2019/0088584 A1* | 3/2019 | Won | H01L 27/124 |

* cited by examiner

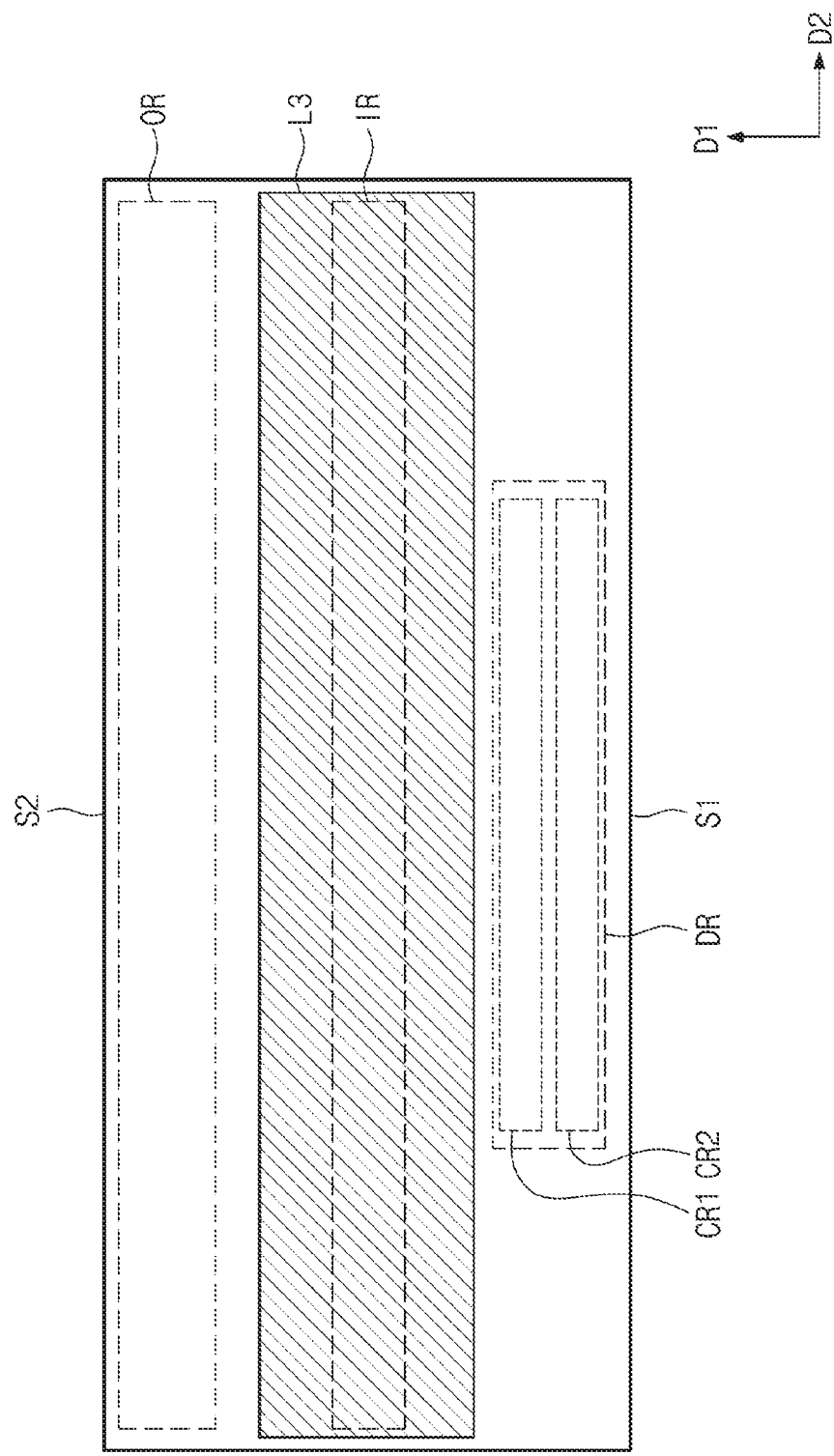

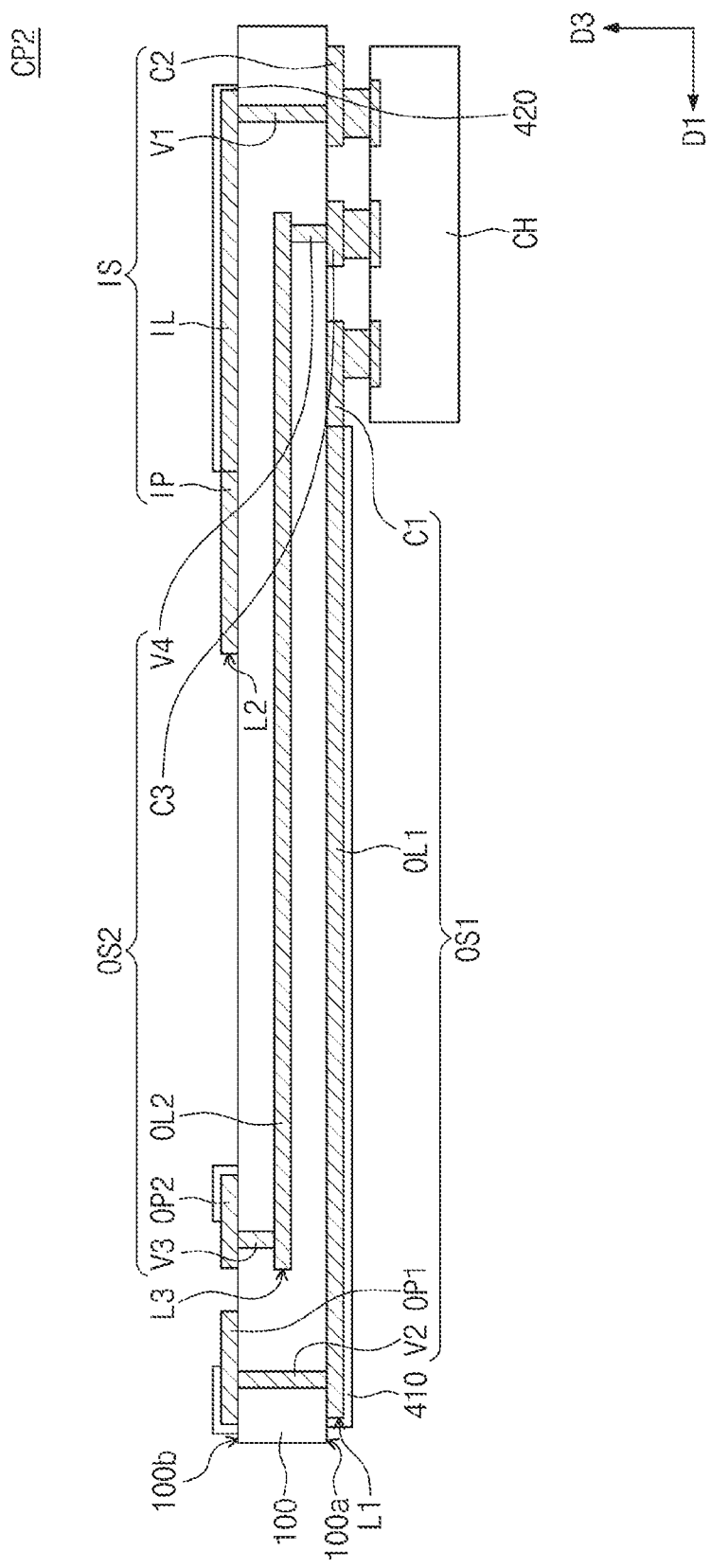

FILM PACKAGE, CHIP-ON-FILM PACKAGE, AND PACKAGE MODULE

CROSS-REFERENCE TO RELATED APPLICATIONS

This U.S. nonprovisional application claims priority under 35 U.S.C § 119 to Korean Patent Application No. 10-2018-0030833 filed on Mar. 16, 2018, in the Korean Intellectual Property Office, the entire contents of which are hereby incorporated by reference.

BACKGROUND

Inventive concepts relate to semiconductor packages, and more particularly, to film packages, chip-on-film packages, and package modules using the same.

A chip-on-film (COF) package technique has been developed to use a flexible film substrate in order to cope with recent trend toward smaller, thinner, and lighter electronic products. According to the COF package technique, a semiconductor chip may be directly flip-chip bonded to a film substrate and coupled through a short lead to an external circuit. The COF package may be applied to portable terminal devices such as a cellular phone and a personal digital assistant (PDA), laptop computers, or display panels.

SUMMARY

According to an example embodiment of the inventive concepts, a film substrate structure for a display device may include a film substrate including a first surface and a second surface opposite to the first surface, an output pattern on at least one of the first surface or the second surface of the film substrate, the output pattern including a first chip pad portion and an output pad portion, the output pad portion electrically connected to the first chip pad portion and spaced apart from the first chip pad portion in a first direction, the output pad portion configured to be connected to the display device, and an input pattern on at least one of the first surface or the second surface of the film substrate, the input pattern including a second chip pad portion and an input pad portion, the input pad portion electrically connected to the second chip pad portion and spaced apart from the second chip pad portion in the first direction, the output pattern vertically overlapping the input pattern with respect to the film substrate, the first chip pad portion and the second chip pad portion configured to be connected to a driver IC chip.

According to an example embodiment of the inventive concepts, a chip on film package for a display device may include a carrier film substrate including a film substrate including a first surface and a second surface opposite to the first surface, an output pattern on at least one of the first surface or the second surface of the film substrate, the output pattern including a first chip pad portion and an output pad portion, the output pad portion electrically connected to the first chip pad portion and spaced apart from the first chip pad portion in a first direction, the output pad portion configured to be connected to the display device, and an input pattern on at least one of the first surface or the second surface of the film substrate, the input pattern including a second chip pad portion and an input pad portion, the input pad portion electrically connected to the second chip pad portion and spaced apart from the second chip pad portion in the first direction, the output pattern vertically overlapping the input pattern with respect to the film substrate, and a driver IC chip electrically connected to the first chip pad portion and the second chip pad portion.

According to an example embodiment of the inventive concepts, a package module may include a carrier film substrate including a film substrate having a C-shape at at least one end thereof including an inner surface and an outer surface opposite to the inner surface, an output pattern on at least one of the inner surface or the outer surface of the film substrate, the output pattern including a first chip pad portion and an output pad portion, the output pad portion electrically connected to the first chip pad portion and spaced apart from the first chip pad portion in a first direction, and an input pattern on at least one of the inner surface or the outer surface of the film substrate, the input pattern including a second chip pad portion and an input pad portion, the input pad portion electrically connected to the second chip pad portion and spaced apart from the second chip pad portion in the first direction, a panel substrate electrically connected to the output pad portion of the output pattern, a display device mounted on the panel substrate, and a driver IC chip electrically connected to the first chip pad portion and the second chip pad portion.

BRIEF DESCRIPTION OF THE DRAWINGS

FIG. 4B illustrates a plan view showing a film substrate structure comprising a third conductive pattern of FIG. 4A.

FIG. 8 illustrates a cross-sectional view showing a chip-on-film package according to an example embodiment of the inventive concepts.

DETAILED DESCRIPTION

Figure 1A:
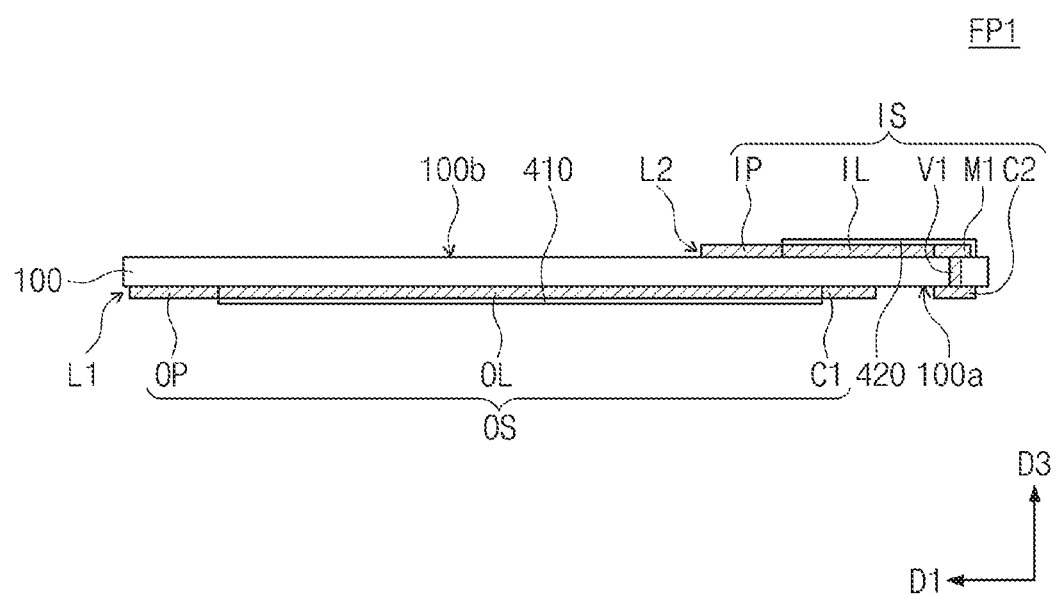
FIGS. 1A, 2A, and 3A illustrate cross-sectional views showing film substrate structures according to some example embodiments of the inventive concepts.
Figure 1B:
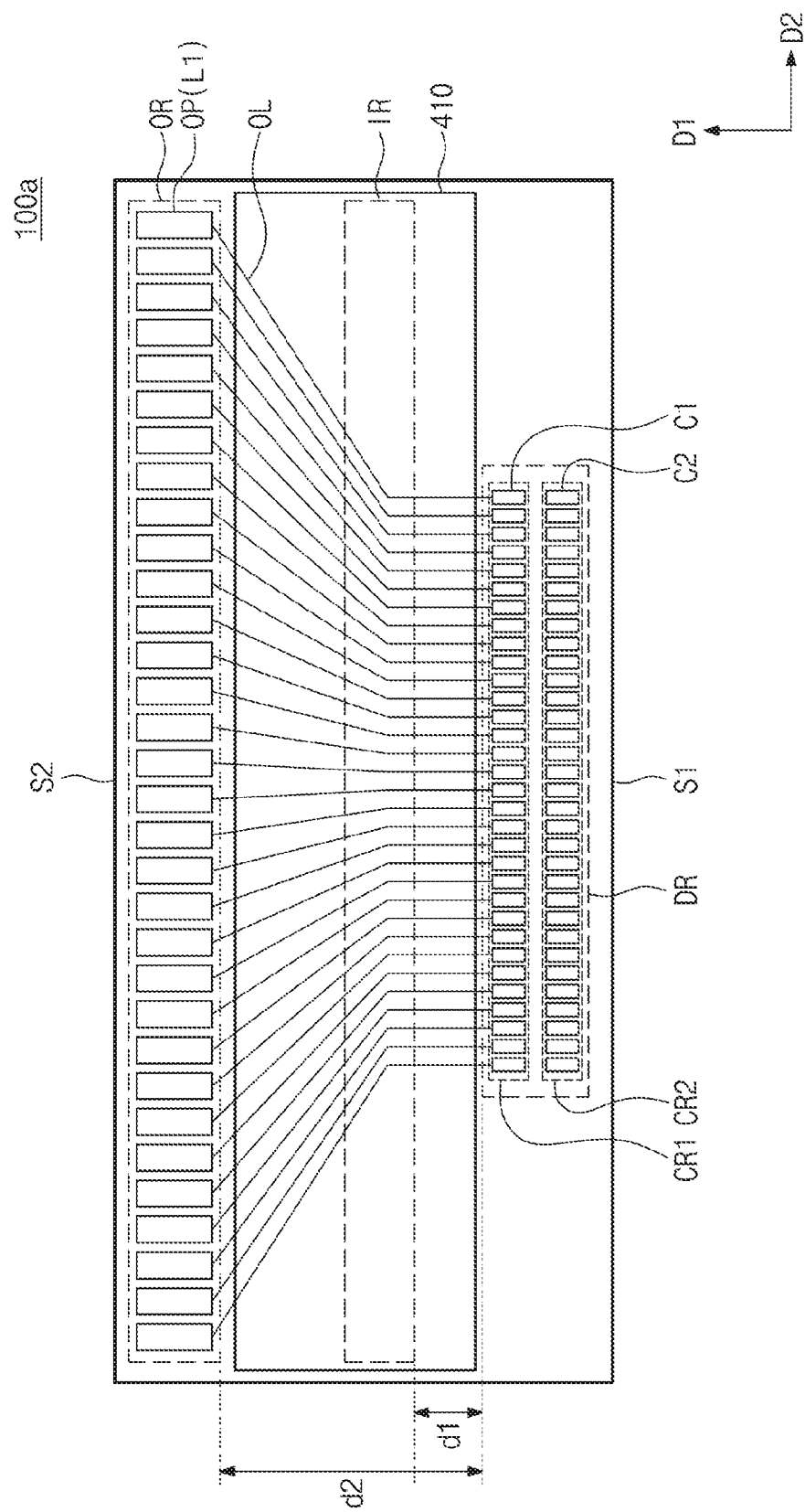
FIGS. 1B, 2B, and 3B illustrate plan views showing first surfaces of the film substrate structures shown in FIGS. 1A, 2A, and 3A, respectively.
Figure 1C:
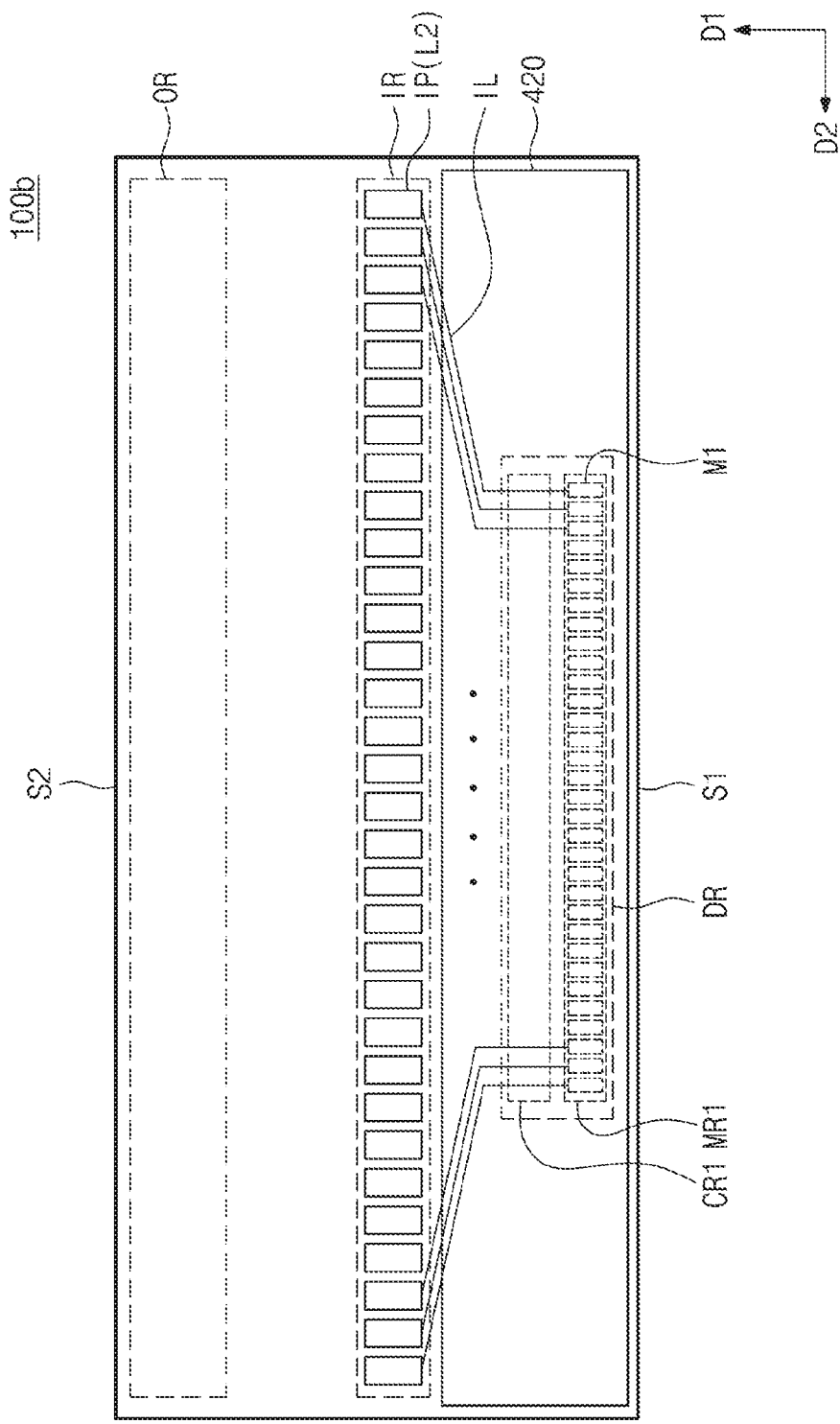
FIGS. 1C, 2C, and 3C illustrate plan views showing second surfaces of the film substrate structures shown in FIGS. 1A, 2A, and 3A, respectively.
Figure 1D:
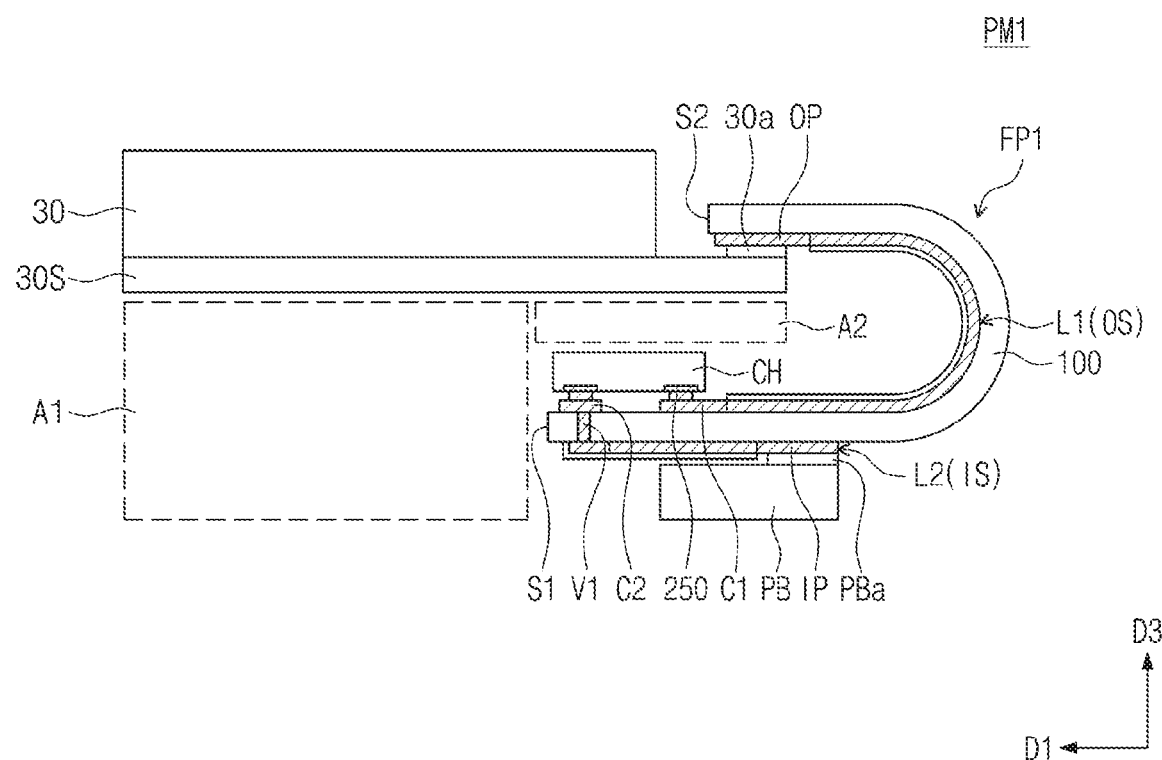
FIGS. 1D, 2D, and 3D illustrate cross-sectional views showing package modules comprising the film substrate structures shown in FIGS. 1A, 2A, and 3A, respectively.

FIG. 1A illustrates a cross-sectional view showing a film substrate structure according to an example embodiment of the inventive concepts. FIG. 1B illustrates a plan view showing a first surface of the film substrate structure shown in FIG. 1A. FIG. 1C illustrates a plan view showing a second surface of the film substrate structure shown in FIG. 1A. FIG. 1D illustrates a cross-sectional view showing a package module comprising the film substrate structure of FIG. 1A.

Referring to FIGS. 1A to 1D, a film substrate structure FP1 according to may include a film substrate 100. The film substrate 100 may include a polymeric material, for example, polyimide or polyester. The film substrate 100 may be flexible. The film substrate 100 may have a relatively smaller length in a first direction D1 and a relatively larger length in a second direction D2 intersecting the first direction D1. For example, the film substrate 100 may include a first edge S1 and a second edge S2 spaced apart in the first direction D1 from the first edge S1.

The film substrate 100 may have a first surface 100a and a second surface 100b opposite to the first surface 100a. A plurality of conductive patterns may be provided on and/or in the film substrate 100. For example, one or more first conductive patterns L1 may be provided on the first surface 100a, and one or more second conductive patterns L2 may be provided on the second surface 100b. In addition, one or more first vias V1 may be provided to penetrate the film substrate 100. The first and second conductive patterns L1 and L2 and the first vias V1 may constitute output patterns OS and input patterns IS. For example, the first and second conductive patterns L1 and L2 and the first vias V1 may each include metal such as copper or aluminum.

For example, the output patterns OS each may include output pad OP, an output line pattern OL, and a first chip pad C1, which are constituent parts of the first conductive patterns L1. In other words, each of the output patterns OS may include an output pad portion OP, a first chip pad portion C1, and an output line portion OL electrically connecting the output pad portion OP with the first chip pad portion C1 on the first surface 100a of the film substrate 100. The output pads OP and the first chip pads C1 may be exposed portions of the first conductive patterns L1 that are not covered with a first passivation layer 410. The first passivation layer 410 may include, for example, solder resist. For brevity of description, FIGS. 1B and 1C show solid lines indicating the output line patterns OL and input line patterns IL discussed below.

An area where the output pads OP are provided may be called an output pad region OR. An area where the first chip pads C1 are provided may be called a first chip pad region CR1. The output pads OP may be arranged in a single row along the second direction D2. In some example embodiments, the output pads OP may be arranged in a plurality of rows. Likewise, the first chip pads C1 may be arranged in a single row along the second direction D2.

In some example embodiments, input pads IP discussed below may be provided on a surface different from that on which the output pads OP are provided. For example, the input patterns IS each may include an input pad IP, an input line pattern IL, and a first connection pad M1, which are constituent parts of the second conductive patterns L2. In other words, each of the input patterns IS may include an input pad portion IP, a first connection pad portion M1, and an input line portion IL electrically connecting the input pad portion IP with the first connection pad portion M1 on the first surface 100a of the film substrate 100, a second chip pad portions C2 on the second surface 100b of the film substrate, and a first via portion penetrating through the film substrate 100 and connecting the first connection pad portion M1 with the second chip pad portion C2. The input patterns IS may further include the first vias V1 and second chip pads C2, which are constituent parts of the first conductive patterns L1. The first vias V1 may connect the first connection pads M1 to the second chip pads C2. The input pads IP may be exposed portions of the second conductive patterns L2, which are not covered with a second passivation layer 420.

The second passivation layer 420 may cover the input line patterns IL and the first connection pads M1. An area where the input pads IP are provided may be called an input pad region IR. An area where the second chip pads C2 are provided may be called a second chip pad region CR2. The input pads IP may be arranged in a single row along the second direction D2. In some example embodiments, the input pads IP may be arranged in a plurality of rows. Likewise, the second chip pads C2 may be arranged in a single row along the second direction D2. FIG. 1C partially shows the input line patterns IL.

A chip mount region DR may be provided on the film substrate 100. The chip mount region DR may be an area on which a semiconductor chip CH of FIG. 1D is disposed. The chip mount region DR may be defined on the first surface 100a. For example, the chip mount region DR may be the exposed portions of the first conductive patterns L1, which are not covered with the first passivation layer 410.

Chip pads may be provided on the chip mount region DR. For example, the chip pads may include the first chip pads C1 and the second chip pads C2. The chip mount region DR may be adjacent to the first edge S1. In some example embodiments, the second chip pad region CR2 may be closer to the first edge S1 than the first chip pad region CR1.

The output pad region OR may be adjacent to the second edge S2. For example, the first surface 100a may be provided on its one end with the output pad region OR and on its opposite end with the chip mount region DR. Both ends of the first surface 100a may not be covered with the first passivation layer 410.

When viewed in a plan view, the input pad region IR may be positioned between the output pad region OR and the chip mount region DR. The chip mount region DR and the output pad region OR may be spaced apart at a second distance d2, which is greater than a first distance d1 between the chip mount region DR and the input pad region IR. For example, the input pad region IR may be closer to the first edge S1 than to the second edge S2.

At least a portion of each of the output patterns OS may overlap a corresponding one of the input patterns IS across the film substrate 100. For example, the input line pattern IL and the output line patterns OL may overlap in a third direction D3, which corresponds to a thickness direction of the film substrate 100. Further, the input pads IP may overlap the output line patterns OL. The first chip pads C1 may overlap the input line patterns IL.

A chip-on-film package according to some example embodiments of the inventive concepts may include a semiconductor chip CH mounted on the film substrate structure FP1. For example, the semiconductor chip CH may be a drive device such as a display driver integrated chip. For example, the semiconductor chip CH may be disposed on the first surface 100a. On the chip mount region DR, the semiconductor chip CH may be connected to the first chip pads C1 and the second chip pads C2. For example, the semiconductor chip CH may be connected through connection terminals 250 to the first chip pads C1 and the second chip pads C2. The connection terminals 250 may be, for example, bumps or solder balls.

The input patterns IS and the output patterns OS may be arranged in the same direction. For example, the input patterns IS may extend in the first direction D1, and the second output patterns OS may also extend in the first direction D1. Referring to FIG. 1D, the output patterns OS may be provided between the semiconductor chip CH and the second edge S2, and none of the first and second conductive patterns L1 and L2 and the first vias V1 constituting the input patterns IS and the output patterns OS may be provided between the semiconductor chip CH and the first edge S1. Thus, the package module PM1 which includes the film substrate structure FP1 and bent as illustrated in FIG. 1D may decrease in length in the first direction D1. FIG. 1D depicts the shape of the package module when it is installed in, for example, a mobile device (e.g., a cell phone, a laptop computer, or a tablet computer.

The semiconductor chip CH and the output pads OP may be spaced apart at a distance greater than the semiconductor chip CH and the input pads IP. For example, the output pads OP may be disposed on the first surface 100a on which the semiconductor chip CH is mounted.

Forming methods of chip-on-film packages according to some example embodiments of the inventive concepts may include attaching a plurality of semiconductor chips CH onto a film substrate structure before a sawing process and performing the sawing process with respect to the film substrate structure. A portion of the film substrate structure that does not experience the sawing process may include a conductive layer to be converted into the first and second conductive patterns L1 and L2 when the sawing process is performed. When the sawing process is performed with respect to the film substrate structure, at least a portion of the conductive layer may be removed. Thus, a conductive layer included in the film substrate structure may be converted into the first and second conductive patterns L1 and L2.

A package module PM1 according to some example embodiments of the inventive concepts may include a display device 30 and a circuit board PB that are connected to the chip-on-film package. The display device 30 may include a panel substrate 30S and a display device 30 provided on and electrically connected to the panel substrate 30S. The circuit board PB may include a flexible printed circuit board (FPCB).

The display device 30 may be connected through the output patterns OS to the semiconductor chip CH. The output pads OP may be connected to pads 30a of the display device 30. In some example embodiments, first connection members (not shown) may be provided between the output pads OP and the pads 30a of the display device 30. The first connection members may include an adhesive polymer layer and conductive particles provided or dispersed in the adhesive polymer layer.

The circuit board PB may be connected through the input patterns IS to the semiconductor chip CH. The input pads IP may be connected to pads PBa of the circuit board PB. In some example embodiments, second connection members (not shown) may be provided between the input pads IP and the pads PBa of the circuit board PB. The second connection members may include an adhesive polymer layer and conductive particles provided or dispersed in the adhesive polymer layer.

As illustrated in FIG. 1D, the film substrate structure FP1 may have an end that reversibly bends toward the display device 30, and faces the panel substrate 30S of the display device 30 thereunder. For example, when the package module PM1 is mounted in an electronic apparatus, the end of the film substrate structure FP1 may be bent under the display device 30. An adhesive protection layer A2 may be provided between the semiconductor chip CH and the panel substrate 30S to protect the semiconductor chip CH1 from an external impact. For example, the adhesive protection layer A2 may include a resilient material such as rubber or sponge.

The first edge S1 of the film substrate structure FP1 and a bottom surface of the panel substrate 30S may define an outer module region A1. Other components of the electronic apparatus comprising the package module PM1 may be provided on the outer module region A1. For example, a battery for driving the electronic apparatus may be provided in the outer module region A1. According to some example embodiments of the inventive concepts, the bent shape of the film substrate structure may decrease a size of footprint of the film substrate structure FP1 in a plan resulting in an increase of a size of the outer module region A1. Thus, the electronic apparatus may accommodate with a higher-capacity battery or an increased number of batteries.

Figure 2A:
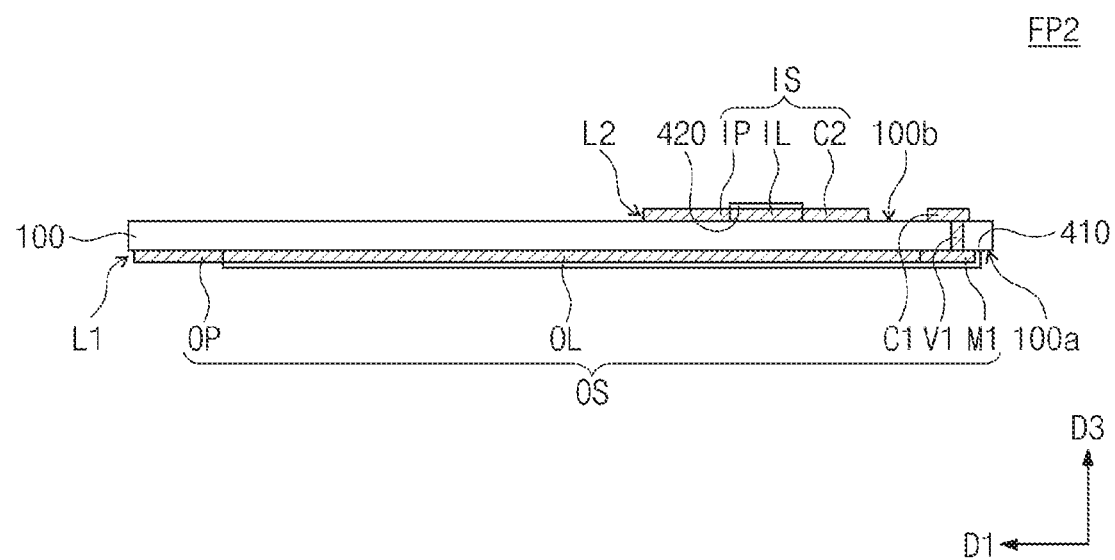
Figure 2B:
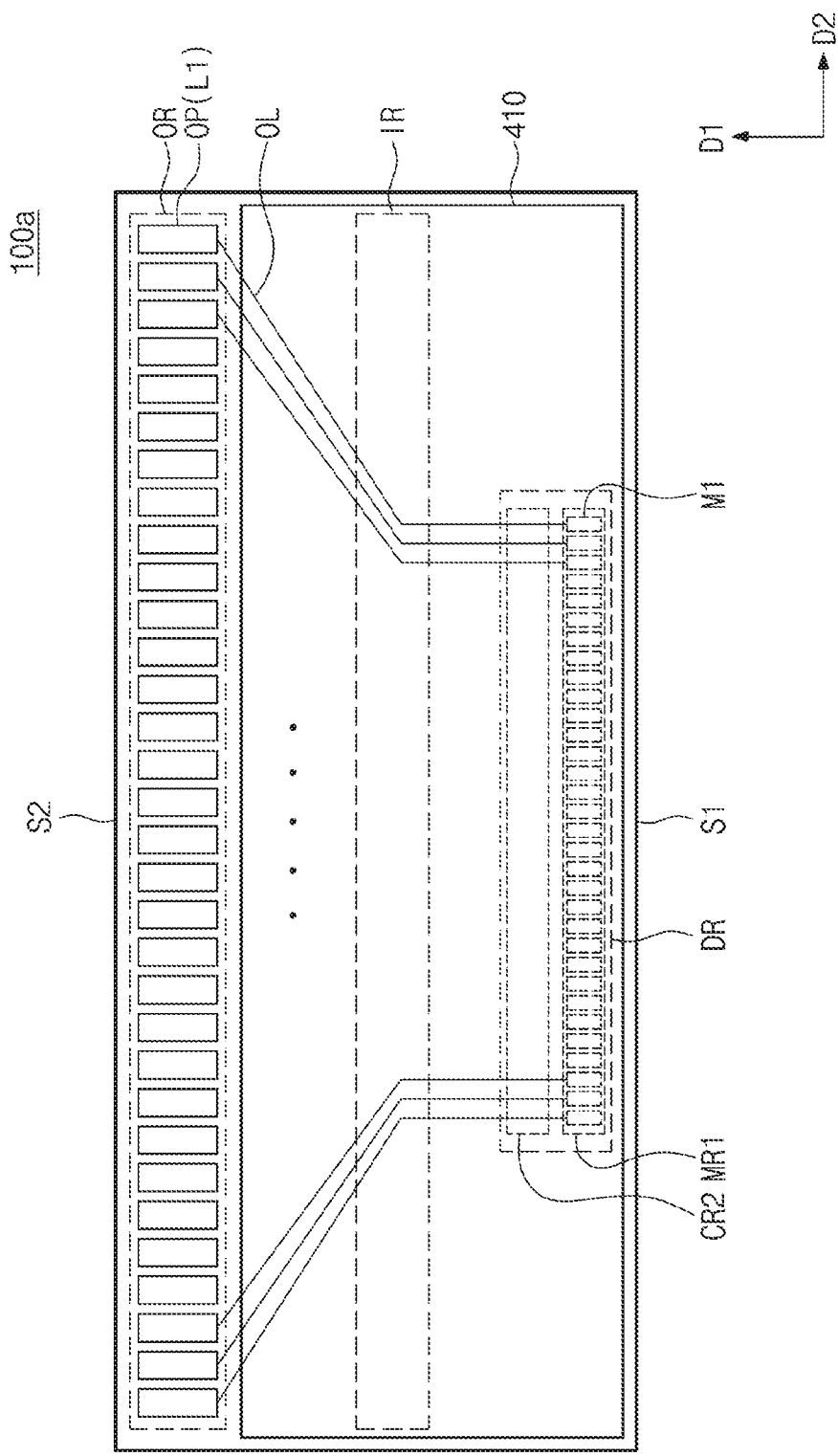
Figure 2C:
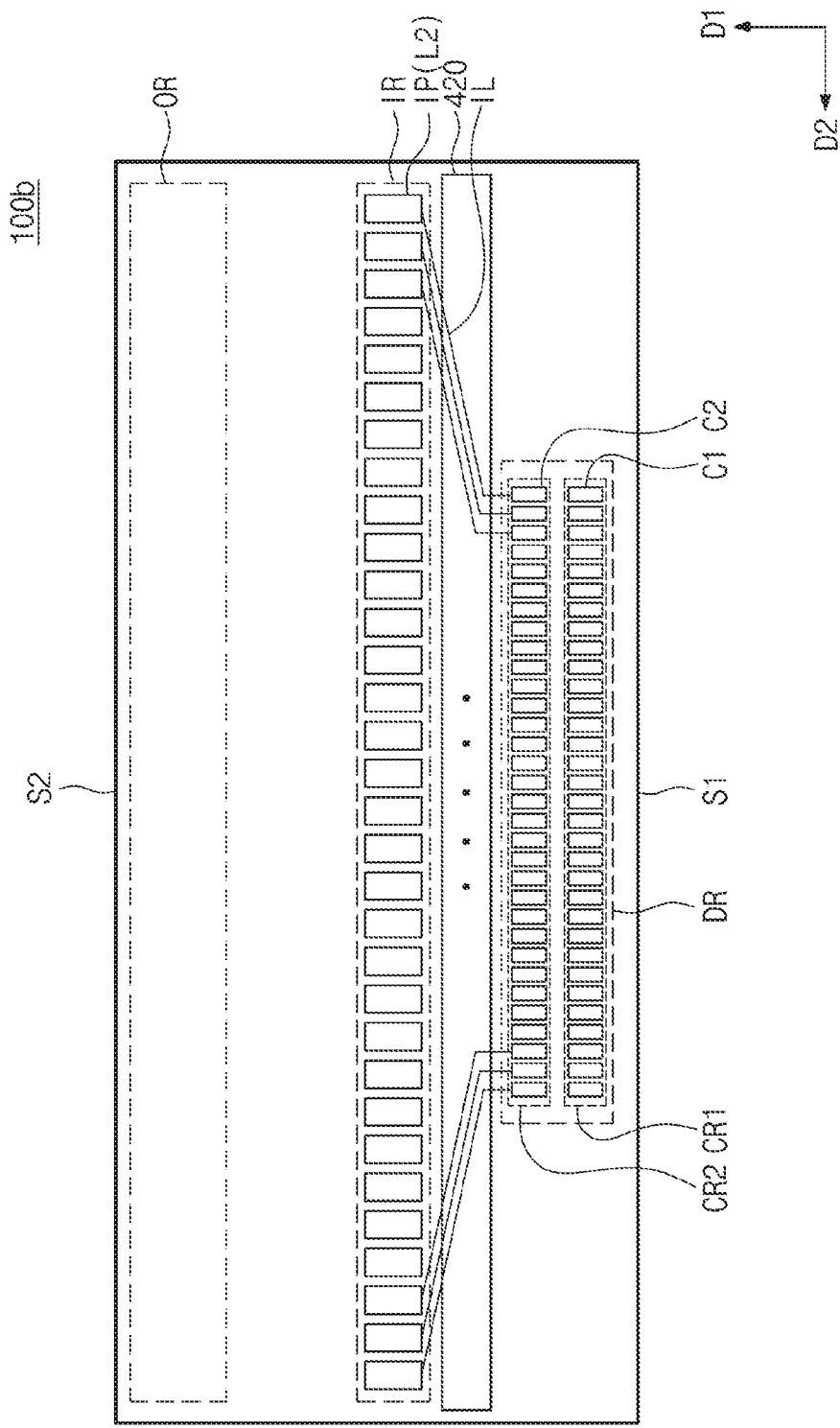
Figure 2D:
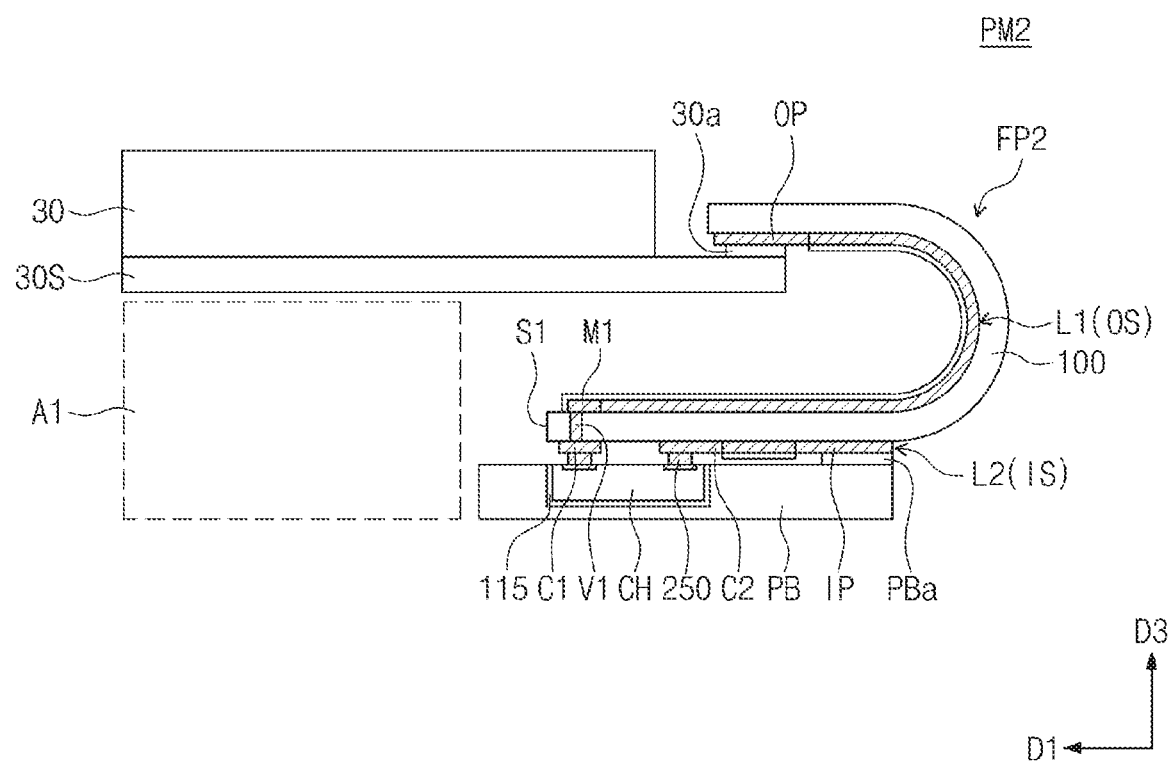

FIG. 2A illustrates a cross-sectional view showing a film substrate structure according to an example embodiment of the inventive concepts. FIG. 2B illustrates a plan view showing a first surface of the film substrate structure shown in FIG. 2A. FIG. 2C illustrates a plan view showing a second surface of the film substrate structure shown in FIG. 2A. FIG. 2D illustrates a cross-sectional view showing a package module comprising the film substrate structure of FIG. 2A. A description of duplicate components will be omitted in the interest of brevity.

Referring to FIGS. 2A to 2D, a film substrate structure FP2 may include the film substrate 100. One or more first conductive patterns L1 may be provided on the first surface 100a, and one or more second conductive patterns L2 may be provided on the second surface 100b. The first and second conductive patterns L1 and L2 and the first vias V1 may constitute the output patterns OS and the input patterns IS. For example, the output patterns OS each may include an output pad OP, an output line pattern OL, a first connection pads M1, the first vias V1, and the first chip pads C1, which are constituent parts of the first conductive patterns L1. In other words, each of the output patterns OS may include an output pad portion OP, a first connection pad portion M1, and an output line portion IL electrically connecting the output pad portion OP with the first connection pad portion M1 on the first surface 100a of the film substrate 100, a first chip pad portion C1 on the second surface 100b of the film substrate, and a first via portion V1 penetrating the film substrate 100 and connecting the first connection pad portion M1 with the first chip pad portion C1. Each of the output patterns OS may further include a first via V1 and a first chip pad C1. The output line patterns OL and the first connection pads M1 may be covered with the first passivation layer 410.

In certain embodiments, the input pads IP may be provided on a surface different from that on which the output pads OP are provided. For example, the input patterns IS each may include an input pad IP, an input line pattern IL, and a second chip pads C2, which are constituent parts of the second conductive patterns L2. In other words, each of the input patterns IS may include an input pad portion IP, a second chip pad C2, and an input line portion IL electrically connecting the input pad portion IP with the second chip pad portion C2. The input line patterns IL may be covered with the second passivation layer 420.

The chip mount region DR may be defined on the second surface 100b. For example, the chip mount region DR may be exposed portions of the second conductive patterns L2, which are not covered with the second passivation layer 420.

The chip mount region DR may be adjacent to the first edge S1. In some example embodiments, the first chip pad region CR1 may be closer to the first edge S1 than the second chip pad region CR2. The output pad region OR may be adjacent to the second edge S2. The input pad region IR may be positioned between the output pad region OR and the chip mount region DR.

At least a portion of each of the output patterns OS may overlap a corresponding one of the input patterns IS across the film substrate 100. For example, the input line patterns IL and the output line patterns OL may overlap in the third direction D3, which corresponds to a thickness direction of the film substrate 100. In addition, the input pads IP and the second chip pads C2 may overlap the output line patterns OL.

A chip-on-film package according to some example embodiments of the inventive concepts may include the semiconductor chip CH mounted on the film substrate structure FP2. The input patterns IS and the output patterns OS may be arranged in the same direction. The semiconductor chip CH may be mounted on the second surface 100b. For example, the output pads OP may be disposed on the first surface 100a, which is opposite to the second surface 100b on which the semiconductor chip CH is mounted.

A package module PM2 according to some example embodiments of the inventive concepts may include the display device 30 and the circuit board PB that are connected to the chip-on-film package. As illustrated in FIG. 2D, the circuit board PB may be disposed on the second surface 100b, on which the semiconductor chip CH is mounted. The circuit board PB may be thicker than that of the semiconductor chip CH. The circuit board PB may cover a top surface of the semiconductor chip CH. The circuit board PB may include a recess region configured to receive or accommodate at least an upper portion of the semiconductor chip CH, and thus at least the upper portion of the semiconductor chip CH may be inserted into the recess region. For example, the circuit board PB may extend beyond the first edge S1. A shielding layer 115 may be provided between the circuit board PB and the semiconductor chip CH to mitigate or prevent signal interference therebetween. For example, the shielding layer 115 may be or include an Electro-magnetic Interference (EMI) tape or a Polyimide (PI) tape.

Figure 3A:
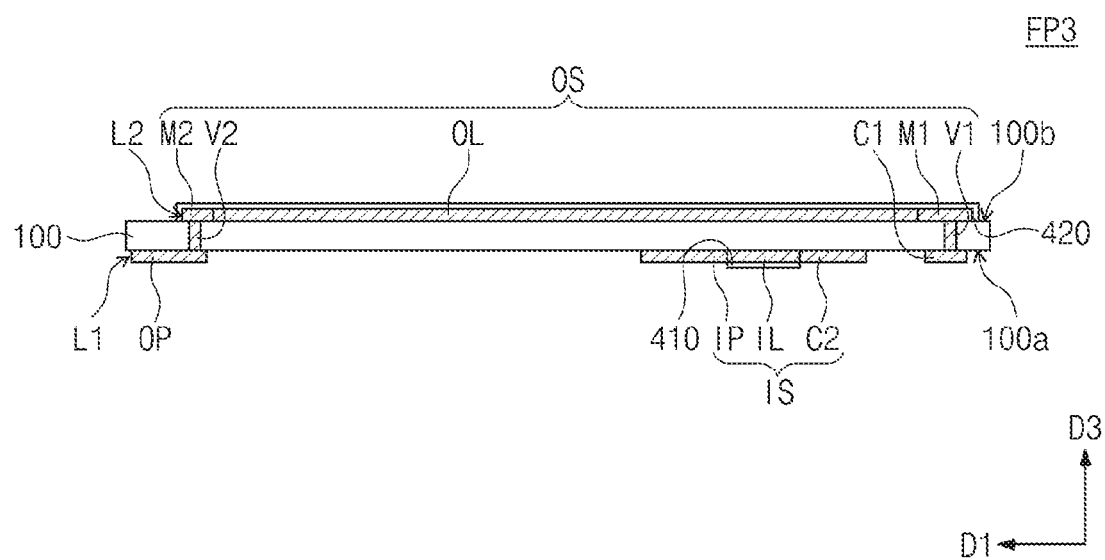
Figure 3B:
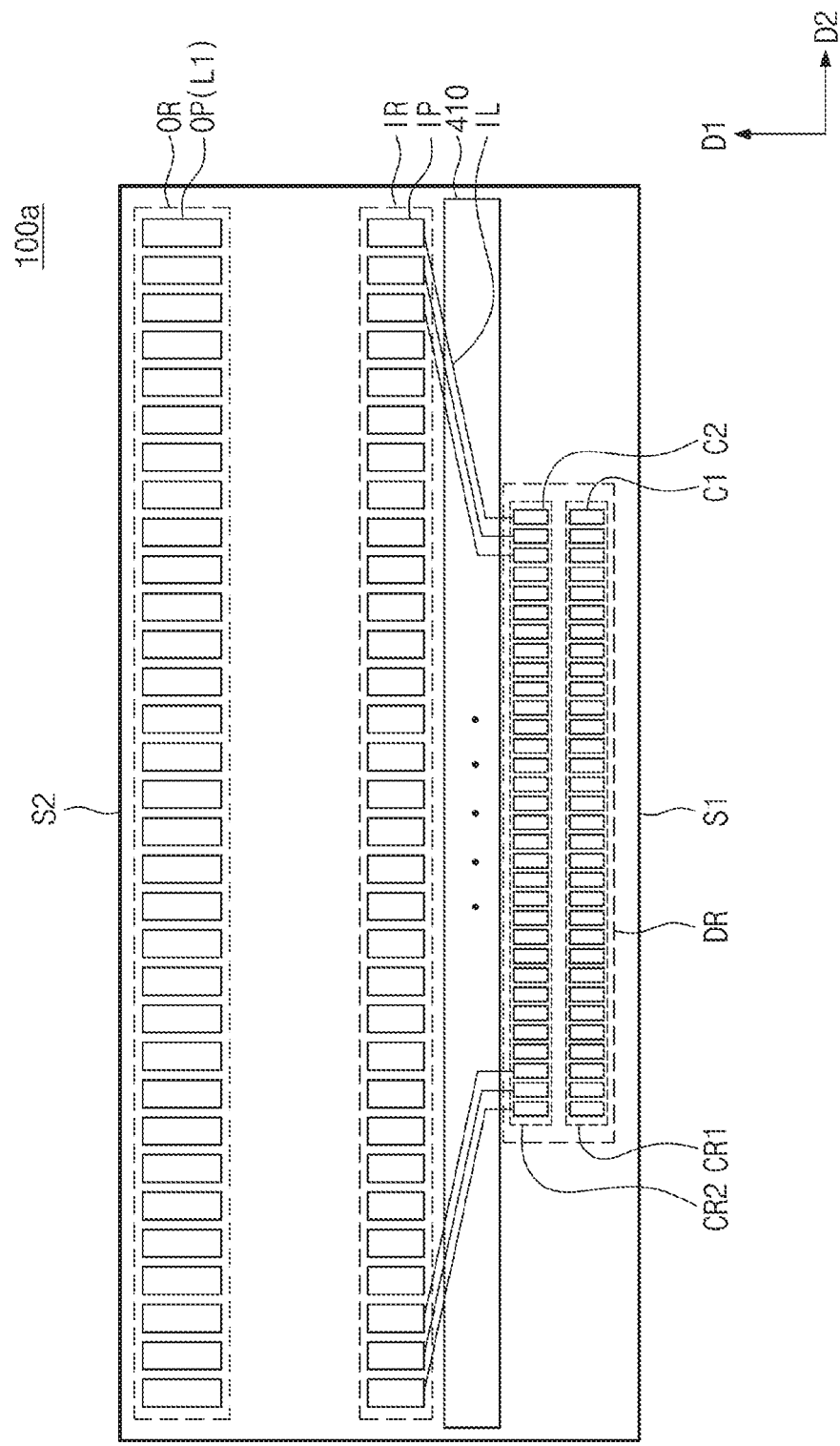
Figure 3C:
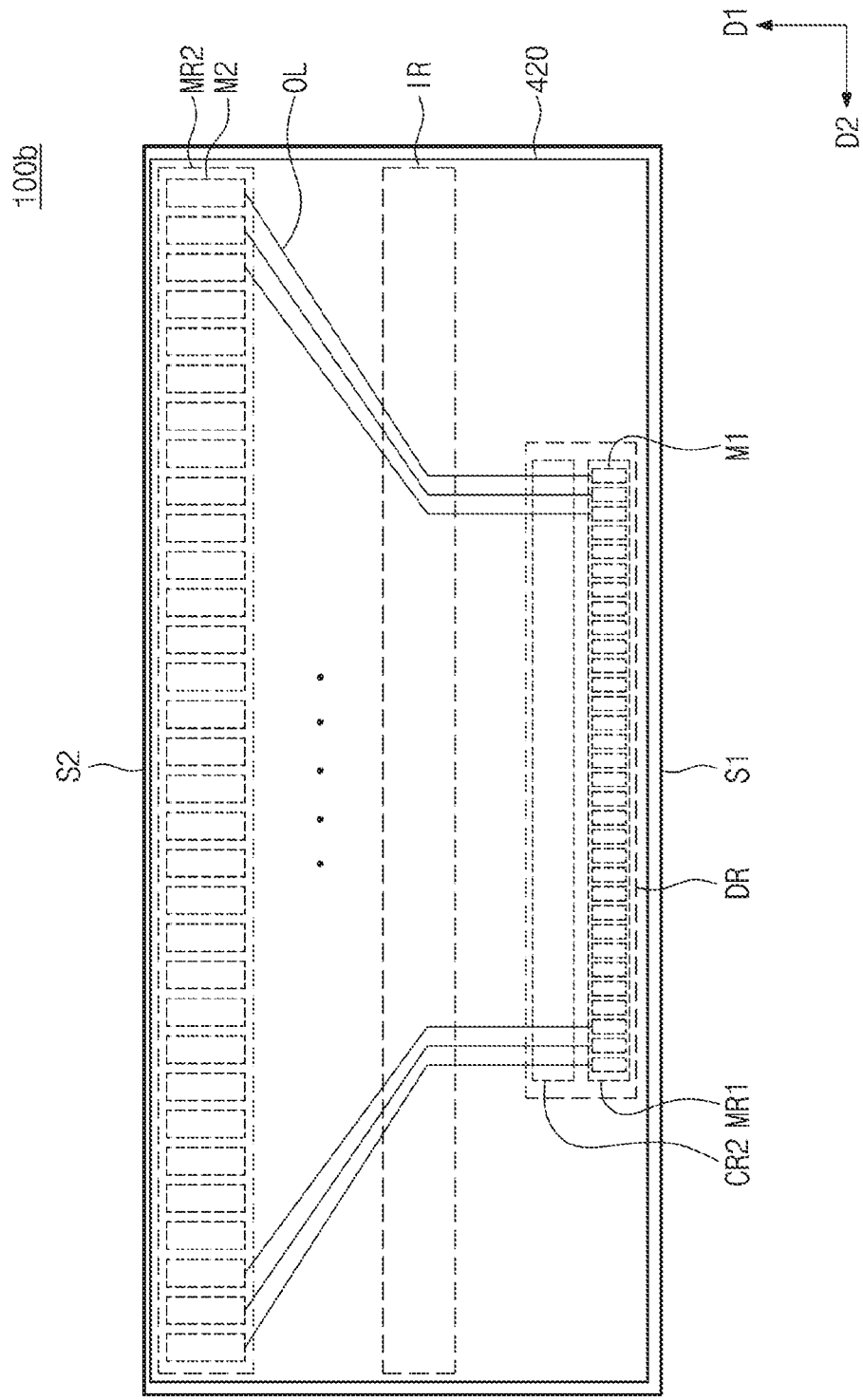
Figure 3D:
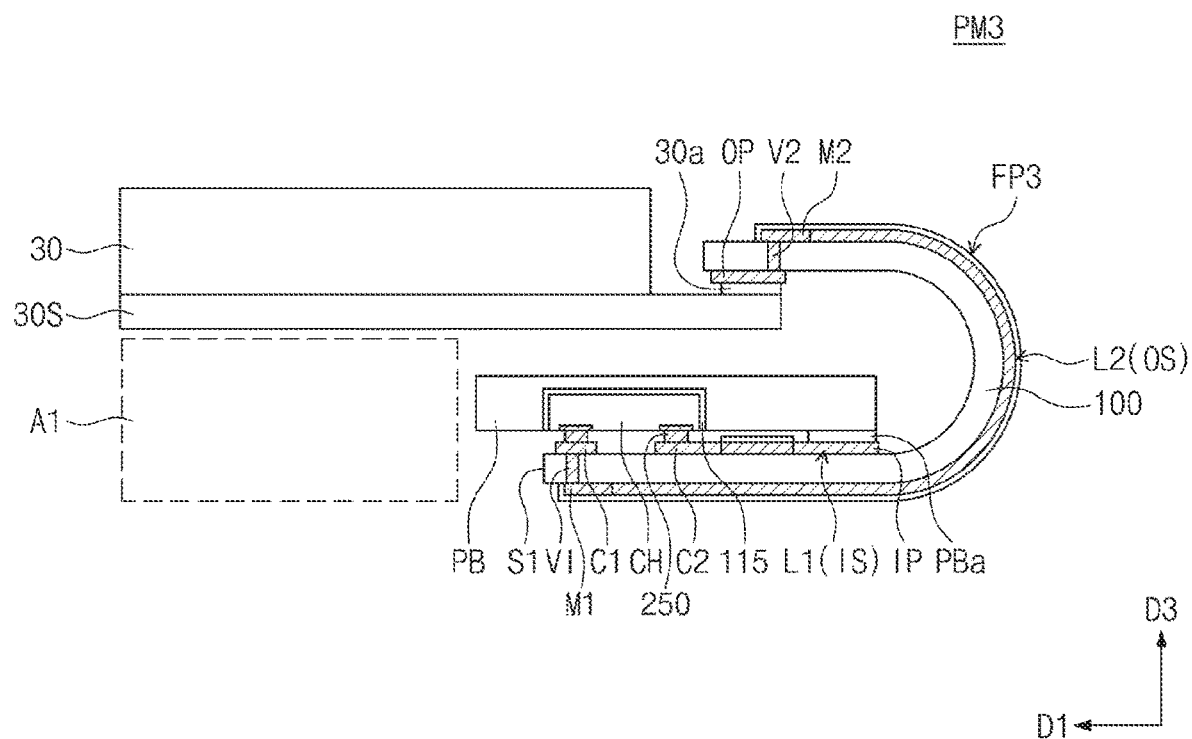

FIG. 3A illustrates a cross-sectional view showing a film substrate structure according to an example embodiment of the inventive concepts. FIG. 3B illustrates a plan view showing a first surface of the film substrate structure shown in FIG. 3A. FIG. 3C illustrates a plan view showing a second surface of the film substrate structure shown in FIG. 3A. FIG. 3D illustrates a cross-sectional view showing a package module comprising the film substrate structure of FIG. 3A. A description of duplicate components will be omitted in the interest of brevity.

Referring to FIGS. 3A to 3D, a film substrate structure FP3 may include the film substrate 100. The film substrate structure FP3 may further include second vias V2 and second connection pads M2. The first and second conductive patterns L1 and L2 and the first and second vias V1 and V2 may constitute the output patterns OS and the input patterns IS. For example, the output patterns OS each may include an output pad OP, a second via V2, a second connection pad M2, an output line patterns OL, a first connection pad M1, a first via V1, and a first chip pad C1. The second via V2 may connect the output pad OP to the second connection pad M2. The first via V1 may connect the first connection pad M1 to the first chip pad C1. In other words, each of the output patterns OS may include an output pad portion OP, a first connection pad portion M1, a second connection pad portion M2, an output line portion OL connecting the first connection pad portion M1 with the second connection pad portion M2, a first chip pad portion C1, a first via portion V1 penetrating through the film substrate 100 and connecting the output pad portion OP with the second connection pad portion M2, a second via portion V2 penetrating through the film substrate 100 and connecting with the first connection pad portion M1 and the first chip pad portion C1.

Referring to FIG. 3A, the input pads IP may be provided on the first surface 100a on which the output pads OP and the first chip pad (or first chip pad portion) C1 from among portions of the output pattern OP are provided. The input pattern IS may be horizontally between the output pads OP and the first chip pad (or first chip pad portion) C1 from among portions of the output pattern OP. The input pattern IS may be vertically under the output line portion OL of the output pattern OP. For example, the input patterns IS may include an input pad IP, an input line pattern IL, and a second chip pads C2, which are constituent parts of the first conductive patterns L1. In other words, each of the input patterns IS may include an input pad portion IP, a second chip pad portion C2, and an input line portion IL electrically connecting the input pad portion IP with the second chip pad portion C2.

The chip mount region DR may be defined on the first surface 100a. For example, the chip mount region DR may be exposed portions of the first conductive patterns L1, which are not covered with the first passivation layer 410. In some example embodiments, the first chip pad region CR1 may be closer to the first edge S1 than the second chip pad region CR2. At least a portion of each of the output patterns OS may overlap a corresponding one the input patterns IS across the film substrate 100. For example, the input line pattern IL and the output line patterns OL may overlap in the third direction D3, which corresponds to a thickness direction of the film substrate 100. In addition, the input pads IP and the second chip pads C2 may overlap the output line patterns OL.

A chip-on-film package according to some example embodiments of the inventive concepts may include the semiconductor chip CH mounted on the film substrate structure FP3. The input patterns IS and the output patterns OS may be arranged in the same direction. The semiconductor chip CH may be mounted on the first surface 100a. For example, the output pads OP may be disposed on the first surface 100a on which the semiconductor chip CH is mounted.

A package module PM3 according to some exemplary embodiments of inventive concepts may include the display device 30 and the circuit board PB that are connected to the chip-on-film package. As illustrated in FIG. 3D, the circuit board PB may be disposed on the first surface 100a on which the semiconductor chip CH is mounted. For example, the circuit board PB may cover a top surface of the semiconductor chip CH.

Referring to FIGS. 1A, 2A, and 3A, the output pattern OS may be on at least one of the first surface 100a or the second surface 100b of the film substrate 100. The output pattern OS may include the first chip pad portion C1 and the output pad portion OP. The output pad portion OP may be electrically connected to the first chip pad portion C1 and spaced apart from the first chip pad portion C1 in the first direction D1. The output pad portion OP may be configured to be connected to the display device. The input pattern IS may be on at least one of the first surface 100a or the second surface 100b of the film substrate 100. The input pattern IS may include the second chip pad portion C2 and the input pad portion IP. The input pad portion IP electrically connected to the second chip pad portion C2 and spaced apart from the second chip pad portion C2 in the first direction D1. The output pattern OS may vertically overlap the input pattern IS with respect to the film substrate 100. The first chip pad portion C1 and the second chip pad portion C2 may be configured to be connected to a driver IC chip that is configured to drive a display device for an electronic apparatus.

Figure 4A:
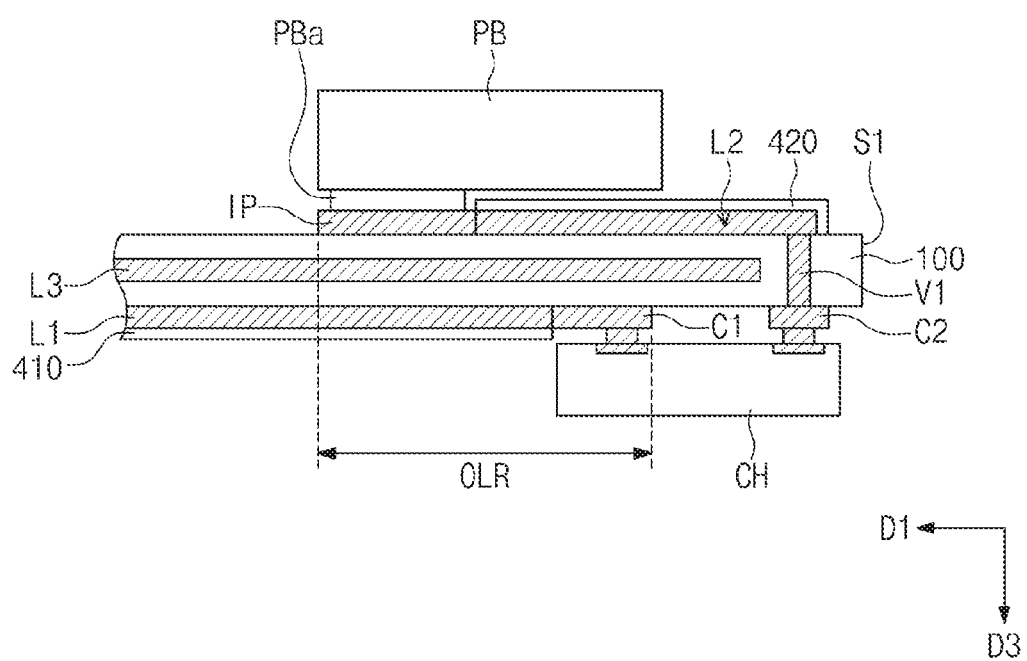
FIG. 4A illustrates a cross-sectional view showing a first edge side of a chip on film package according to an example embodiment of the inventive concepts.

FIG. 4A illustrates a cross-sectional view showing the first edge S1 of a chip on film package according to an example embodiment of the inventive concepts. FIG. 4B illustrates a plan view showing a film substrate structure comprising a third conductive pattern L3 of FIG. 4A. A description of duplicate components may be omitted in the interest of brevity.

In some example embodiments, a multi-layered structure including a plurality of conductive pattern provided on and in the film substrate 100 may be provided. For example, as illustrated in FIGS. 4A and 4B, the third conductive pattern L3 may be provided between the first conductive pattern L1 and the second conductive pattern L2. According to some example embodiments of the inventive concepts, the third conductive pattern L3 may constitute neither the output patterns OS nor the input patterns IS, and operate as a shielding layer that reduces or prevents signal interference between the output patterns OS and the input patterns IS. For example, the third conductive pattern L3 may be provided on an overlap region OLR between the first conductive pattern L1 and the second conductive pattern L2. Although FIG. 4B shows that the third conductive pattern L3 does not overlap the output pad region OR, the third conductive pattern L3 may extend toward the second edge S2 so as to cover the output pad region OR. Further, although FIG. 4B shows that the third conductive pattern L3 does not cover the chip mount region DR, the third conductive pattern L3 may cover at least a portion of the chip mount region DR. For example, the third conductive pattern L3 may cover the first chip pad region CR1.

Figure 5:
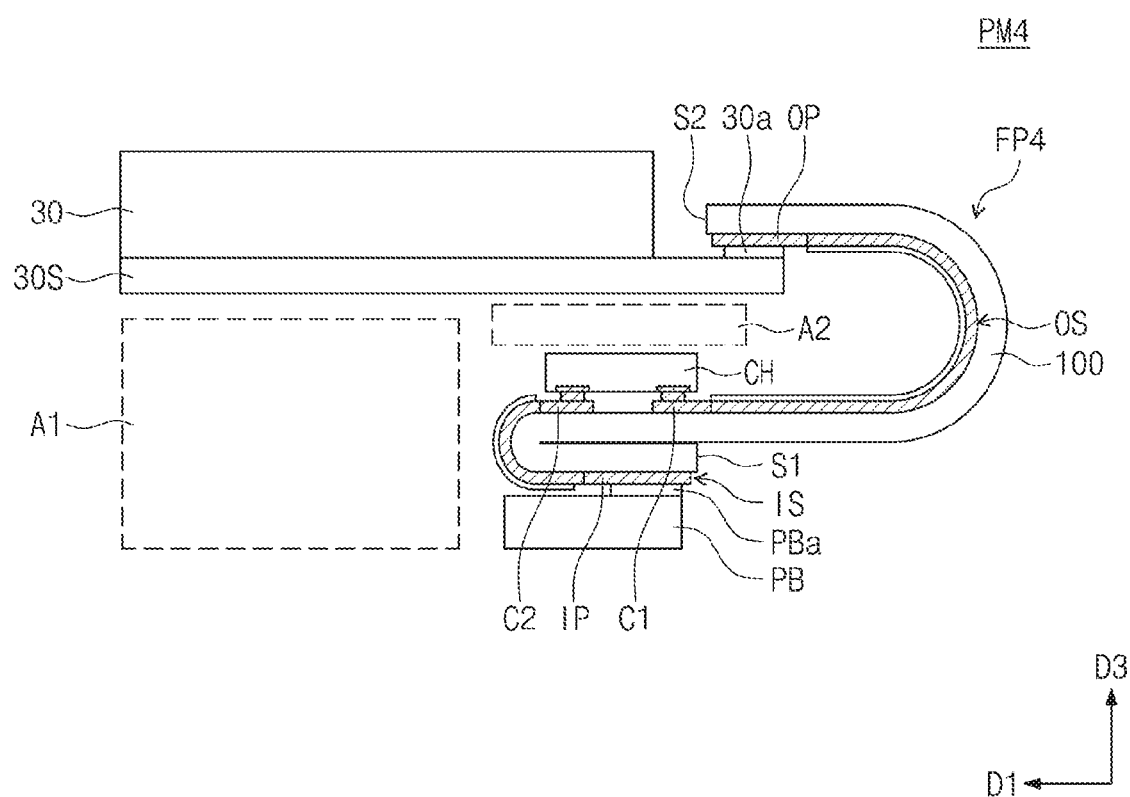
FIG. 5 illustrates a cross-sectional view showing a package module comprising a chip on film package according to an example embodiment of the inventive concepts.

FIG. 5 illustrates a cross-sectional view showing a package module PM4 comprising a chip on film package according to an example embodiment of the inventive concepts. Although a film substrate structure FP4 illustrated in FIG. 5 shows that a single-layered conductive pattern constitute the output patterns OS and the input patterns IS, example embodiments are not limited thereto. According to some example embodiments, the film substrate structure FP4 may include two or more conductive patterns.

Referring FIG. 5, the first edge S1 of the film substrate structure FP4 may bend such that the circuit board PB mounted on the film substrate 100 is spaced apart from the semiconductor chip CH in the third direction D3 with the film substrate 100 sandwiched between the circuit board PB and the semiconductor chip CH. Thus, an electronic apparatus including the package module PM4 may have an expanded outer module region A1.

Figure 6:
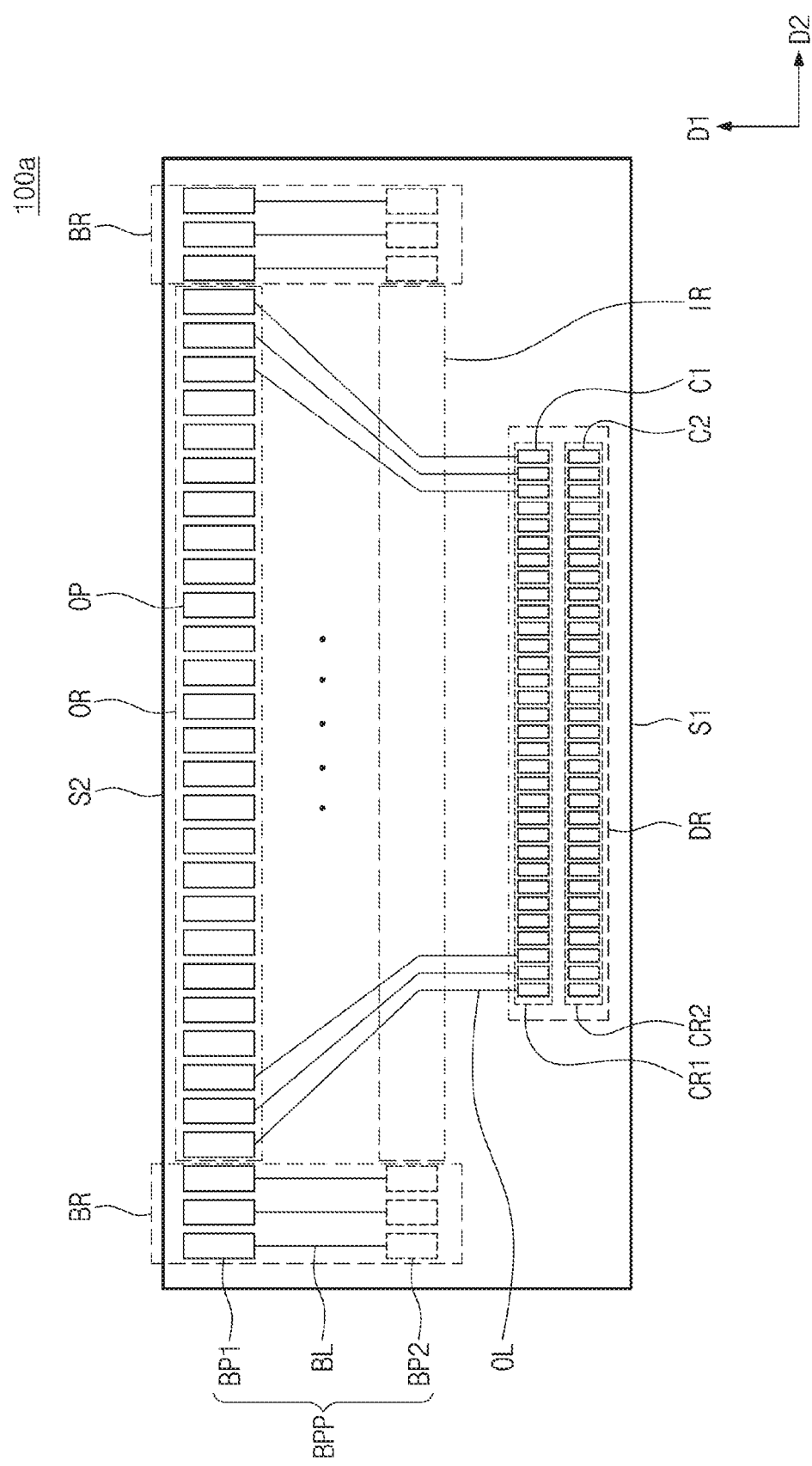
FIG. 6 illustrates a plan view showing a first surface of a film substrate structure according to an example embodiment of the inventive concepts.

FIG. 6 illustrates a plan view showing a first surface of a film substrate structure according to an example embodiment of the inventive concepts.

Referring to FIG. 6, bypass regions BR in which bypass patterns BPP are disposed may be provided on the film substrate 100. The bypass patterns BPP may include first bypass pads BP1 on at least one side of the output pad region OR and second bypass pads BP2 on at least one side of the input pad region IR. The first bypass pads BP1 may be disposed along an arrangement direction of the output pads OP. The second bypass pads BP2 may be disposed along an arrangement direction of the input pads (see IP of FIG. 1C).

Bypass lines BL may be provided to connect the first bypass pads BP1 to the second bypass pads BP2. As illustrated in FIG. 6, when the first bypass pads BP1 and the second bypass pads BP2 are provided on different surfaces from each other, the bypass lines BL may include vias that penetrate the film substrate 100 so as to connect the first bypass pads BP1 to the second bypass pads BP2.

The first and second bypass pads BP1 and BP2 may be spaced apart in the first direction D1 from the chip mount region DR (e.g., from the first chip pads C1). In such a configuration, the bypass patterns BPP and the chip mount region DR may not overlap in a horizontal direction (e.g., in the second direction D2). The bypass patterns BPP may be wiring lines for connecting a display device (see the display device 30 of FIG. 1D) and a circuit board (see the circuit board PB of FIG. 1D) to each other without via the semiconductor chip CH. Thus, the bypass patterns BPP may communicate signals between the display device and the circuit board with reduced resistance. According to some example embodiments of the inventive concepts, the bypass patterns BPP may be confinedly provided between the chip mount region DR and the second edge S2.

Figure 7:
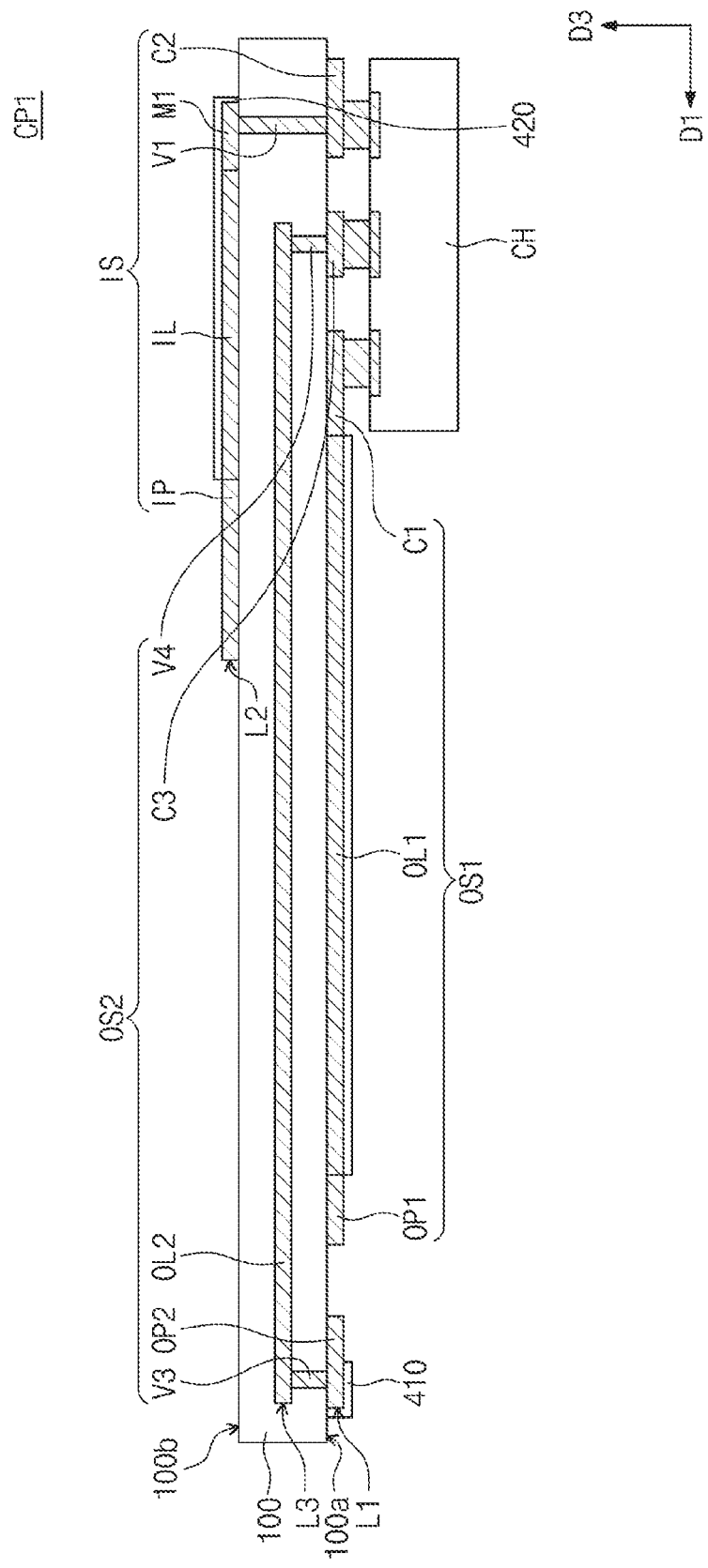
FIG. 7 illustrates a cross-sectional view showing a chip-on-film package according to an example embodiment of the inventive concepts.

FIG. 7 illustrates a cross-sectional view showing a chip-on-film package CP1 according to an example embodiment of the inventive concepts. A description of duplicate components will be omitted in the interest of brevity.

Referring to FIG. 7, the chip-on-film package CP1 may include a film substrate 100. The chip-on-film package CP1 may include a semiconductor chip CH mounted on a film substrate structure including the film substrate 100.

First, second, and third conductive patterns L1, L2, and L3 and vias V1, V3, and V4 may constitute first and second output patterns OS1 and OS2 and input patterns IS. The third conductive patterns L3 may be provided between the first conductive patterns L1 and the second conductive patterns L2.

For example, the first output patterns OS1 may include first output pads OP1, first output line patterns OL1, and first chip pads C1. The second output patterns OS2 may include second output pads OP2, second output line patterns OL2, third chip pads C3, and vias V3 and V4. The first output patterns OS1 and the second output patterns OS2 may be respectively connected to first terminals and second terminals of the semiconductor chip CH. For example, the first terminals of the semiconductor chip CH may be arranged in a single row, and the second thermals of the semiconductor chip CH may be arranged in a single row along the first terminals.

The input patterns IS may include input pads IP, input line patterns IL, first connection pads M1, first vias V1, and second chip pads C2. A package module according to some example embodiments of the inventive concepts may include a display device (not shown in FIG. 7) and a circuit board (not shown in FIG. 7) that are connected to the chip-on-film package CP1.

FIG. 8 illustrates a cross-sectional view showing a chip-on-film package CP2 according to an example embodiment of the inventive concepts. A description of duplicate components will be omitted in the interest of brevity.

Referring to FIG. 8, the chip-on-film package CP2 may include a film substrate 100. The chip-on-film package CP2 may include a semiconductor chip CH mounted on the film substrate 100.

First, second, and third conductive patterns L1, L2, and L3 and vias V1, V2, V3, and V4 may constitute output patterns OS and input patterns IS. For example, the first output patterns OS1 may include first output pads OP1, first output line patterns OL1, second vias V2, and first chip pads C1. The second output patterns OS2 may include second output pads OP2, second output line patterns OL2, third chip pads C3, and vias V3 and V4. The first output patterns OS1 and the second output patterns OS2 may be respectively connected to first terminals and second terminals of the semiconductor chip CH.

According to some example embodiments of the inventive concepts, a film substrate structure may be mounted on an electronic apparatus (e.g., a cell phone, a laptop computer, or a tablet computer) to form a package module such that at least one end portion of the film substrate is bend, thereby occupying a smaller footprint when viewed in a plan view. Furthermore, the size of an outer module region defined by the package module and used to accommodate other components for driving an electronic apparatus may be increased, and thereby enabling a compact package module.

This detailed description of the inventive concepts should not be construed as limited to the example embodiments set forth herein, and it is intended that the inventive concepts cover the various combinations, the modifications and variations of the disclosed example embodiments without departing from the spirit and scope of the inventive concepts. The appended claims should be construed to include other example embodiments.

What is claimed is:

1. A film substrate structure for a display device comprising:
   a film substrate including a first surface and a second surface opposite to the first surface;
   an output pattern on at least one of the first surface or the second surface of the film substrate, the output pattern including a first chip pad portion and an output pad portion, the output pad portion electrically connected to the first chip pad portion and spaced apart from the first chip pad portion in a first direction, the output pad portion configured to be connected to and overlap the display device; and
   an input pattern on at least one of the first surface or the second surface of the film substrate, the input pattern including a second chip pad portion and an input pad portion, the input pad portion electrically connected to the second chip pad portion and spaced apart from the second chip pad portion in the first direction, the output pattern vertically overlapping the input pattern with respect to the film substrate, the first chip pad portion and the second chip pad portion configured to be connected to a driver IC chip,
   wherein the output pad portion, the input pad portion and the first and second chip pad portions are sequentially disposed along the film substrate.

2. The film substrate structure of claim 1, wherein
   the film substrate includes a first edge and a second edge opposite to the first edge in the first direction, and
   the first chip pad portion and the second chip pad portion are adjacent to the first edge.

3. The film substrate structure of claim 2, wherein
   the output pad portion is adjacent to the second edge of the film substrate, and
   the input pad portion is horizontally between the output pad portion and the second chip pad portion.

4. The film substrate structure of claim 3, wherein
   the output pad portion is on the first surface of the film substrate, and
   the input pad portion is on the second surface of the film substrate.

5. The film substrate structure of claim 4, wherein the first chip pad portion and the second chip pad portion are on the first surface of the film substrate.

6. The film substrate structure of claim 5, wherein the input pattern further includes a conductive via portion penetrating the film substrate and a input line portion on the second surface of the film substrate, the conductive via portion and the input line portion electrically connecting the input pad portion on the second surface of the film substrate to the second chip pad portion on the first surface of the film substrate.

7. The film substrate structure of claim 4, wherein the first chip pad portion and the second chip pad portion are on the second surface of the film substrate.

8. The film substrate structure of claim 7, wherein the output pattern further includes a conductive via portion penetrating the film substrate and an output line portion on the first surface of the film substrate, the conductive via portion and the output line portion electrically connecting the output pad portion on the first surface of the film substrate to the first chip pad portion on the second surface of the film substrate.

9. The film substrate structure of claim 3, wherein
   the output pad portion and the first chip pad portion of the output pattern and the input pad portion and the second chip pad portion of the input pattern are on the first surface of the film substrate, and
   the output pattern further includes a first via conductive portion penetrating the film substrate, an output line portion on the second surface of the film substrate, a second via conductive portion penetrating the film substrate, the first via conductive portion connecting a first edge region of the output line portion to the output pad portion, the second via conductive portion connecting a second edge region of the output line portion to the first chip pad portion, the second edge region of the output line portion being opposite to the first edge region of the output line portion.

10. The film substrate structure of claim 1, wherein
    the output pattern further includes an output line portion on one of the first surface or the second surface of the film substrate, the output line portion electrically connecting the output pad portion to the first chip pad portion,
    the input pattern further includes an input line portion on the other one of the first surface or the second surface of the film substrate, the input line portion electrically connecting the input pad portion to the second chip pad portion, and
    the output line portion vertically overlaps the input line portion with respect to the film substrate.

11. The film substrate structure of claim 1, wherein the film substrate further includes an insulating layer and a conductive shielding layer embedded therein and configured to prevent signal interference between the output pattern and the input pattern.

12. The film substrate structure of claim 1, further comprising:
    a bypass pattern on the film substrate, the bypass pattern including a first bypass pad portion at a side of the output pad portion, a second bypass pad portion at a side of the input pad portion, and a bypass line portion electrically connecting the first bypass pad portion to the second bypass pad portion.

13. A chip on film package for a display device comprising:
    a carrier film substrate including,
    a film substrate including a first surface and a second surface opposite to the first surface,
    an output pattern on at least one of the first surface or the second surface of the film substrate and extending in a first direction, the output pattern including a first chip pad portion, an output pad portion spaced apart from the first chip pad portion in the first direction, and an output line portion directly connecting the output pad portion to the first chip pad portion, the output pad portion configured to be connected to the display device, and an input pattern on at least one of the first surface or the second surface of the film substrate, the input pattern including a second chip pad portion and an input pad portion, the input pad portion electrically connected to the second chip pad portion and spaced apart from the second chip pad portion in the first direction, the output pattern vertically overlapping the input pattern with respect to the film substrate; and a driver IC chip electrically connected to the first chip pad portion and the second chip pad portion.

14. The chip on film package of claim 13, wherein the film substrate includes a first edge and a second edge opposite to the first edge in the first direction, the driver IC chip is adjacent to the first edge of the film substrate, and the output pad portion and the input pad portion are horizontally between the driver IC chip and the second edge of the film substrate.

15. The chip on film package of claim 13, wherein a distance between the driver IC chip and the output pad portion is greater than a distance between the driver IC chip and the input pad portion.

16. The chip on film package of claim 13, wherein the output pad portion is on the first surface of the film substrate, and the input pad portion is on the second surface of the film substrate.

17. The chip on film package of claim 13, wherein the output pad portion and the input pad portion are on the first surface of the film substrate.

18. The chip on package of claim 13, wherein the input pattern further includes an input line portion on the other one of the first surface or the second surface of the film substrate, the input line portion electrically connecting the input pad portion to the second chip pad portion, and the output line portion vertically overlaps the input line portion with respect to the film substrate.

19. The chip on film package of claim 13, wherein the film substrate further includes an insulating layer and a conductive shielding layer embedded therein and configured to prevent signal interference between the output pattern and the input pattern.

20. The film substrate structure of claim 1, wherein the input pad portion overlaps a circuit board, and the first and second chip pad portions overlap the driver IC chip.

* * * * *